United States Patent [19]
Cheng et al.

[11] Patent Number: 6,034,671
[45] Date of Patent: Mar. 7, 2000

[54] PHOTOCOUPLING SIGNAL DETECTION CIRCUIT FOR A COMPUTER MOUSE

[75] Inventors: Wen-Ping Cheng, TaoYuan; Min-Kun Wang; Fang-Diahn Guo, both of Hsinchu; Chi-Ho Hsu, Taipei, all of Taiwan

[73] Assignee: Holtek Semiconductor Inc., Taiwan

[21] Appl. No.: 08/985,881

[22] Filed: Dec. 5, 1997

[30] Foreign Application Priority Data

Aug. 28, 1997 [TW] Taiwan ................................. 86112413

[51] Int. Cl.$^7$ ....................................................... G09G 5/08
[52] U.S. Cl. ........................... 345/163; 345/164; 345/166
[58] Field of Search ................................... 345/156–184; 341/17, 20–23, 31–33, 13; 250/208–232

[56] References Cited

U.S. PATENT DOCUMENTS 5,644,127 7/1997 Ohmae ..................................... 345/164

Primary Examiner—Richard A. Hjerpe
Assistant Examiner—Anthony J. Blackman
Attorney, Agent, or Firm—Raymond Sun

[57] ABSTRACT

A photocoupling signal detection circuit for a computer mouse to simplify the design of circuit by tracking the slope change of input voltage waveform and produce a digital output which can detect the movement of computer mouse is disclosed. This signal detection circuit includes a comparator, a state decision circuit, an up/down counter, and a D/A converter. The comparator produces an up/down signal connected to the state decision circuit, then the up/down signal connected to the up/down counter to transfer the up/down signal into a digital signal output. The digital signal connected to a D/A converter for transferring into an analog signal, and the analog signal can be compared with the output signal of an phototransistor. According to the state of up/down signal, the state decision circuit determines if the phototransistor is turned on or turned off and outputs different state signals, based on its determination. The output state signal is further utilized for the detection of a computer mouse.

4 Claims, 5 Drawing Sheets

PHOTOCOUPLING SIGNAL DETECTION CIRCUIT FOR A COMPUTER MOUSE

BACKGROUND OF THE INVENTION (1) Field of the Invention

The present invention relates to integrated circuits, particularly to a photocoupling signal detection circuit for a computer mouse.

(2) Description of the Prior Art

According to the movement of a computer mouse rolling ball, a phototransistor has to detect the movement, and a detection circuit determines whether the phototransistor is turned on or turned off for comparing with a reference voltage, so that a state signal is generated for the other control circuit of the computer mouse. FIG. 1 is a schematic diagram of a typical detection circuit of the optical coupling input signal for a computer mouse. The conventional detection circuit includes a comparator 4 for comparing a fixed reference voltage 5 with the output signal of a phototransistor 1 to produce signals representative of the conduction/cut-off status of phototransistor. Reference voltage 5 is fixed at a predetermined level that is used to decide if the phototransistor 1 is conducted or cut-off. In operation, if the level of the noninverting input of comparator 4 is higher than the fixed reference voltage 5, the output signal of the comparator 4 will be "HIGH". At this time, the phototransistor 1 is conducted. On the contrary, if the level of the noninverting input of comparator 4 is lower than the fixed reference voltage 5, the output signal of the comparator 4 will be "LOW". At this time, the phototransistor 1 is cut-off. So the output signal of the comparator 4 can represent whether the phototransistor 1 is conducted or cut-off. It is an important drawback that the detection circuit can't detect the corrected input signal when the level of the input signal voltage of phototransistor 1 is over or under the level of the fixed reference voltage 5.

FIG. 2 is a block diagram of a prior art detection circuit 6 of reference voltage for a computer mouse. There is shown an automatic detection circuit which comprises a voltage divider 70 connected to an analog multiplexer 71 as a D/A converter in FIG. 2. The analog multiplexer 71 is connected to two comparators 72 for comparing with the signal VIN+, and the output signals of the two comparators 72 are connected to an input voltage tracking circuit 73 which is connected with an up/down counter 74 for counting the input voltage. The signals between the input voltage tracking circuit 73 and the up/down counter 74 are connected to a maximum detection circuit 75, and the maximum detection circuit 75 is commonly connected with a maximum latch circuit 77 and a minimum latch circuit 78. A clock 76 is connected to both of the input voltage tracking circuit 73 and the maximum detection circuit 75, and the output signal of up/down counter 74 is connected to the maximum latch circuit 77, the minimum latch circuit 78, and the analog multiplexer 71 at the same time. An averager 79 is connected with the maximum latch circuit 77 and the minimum latch circuit 78 for taking the average of maximum and minimum signals, then it is also connected to a signal latch circuit 80 for latching the average value. The output signal of signal latch circuit 80 is connected to an analog multiplexer 81 connected with a voltage divider 82, and the output signal of the analog multiplexer 81 is the reference voltage that we have to use in computer mouse. In brief, the prior art detection circuit 6 is used to detect the maximum or minimum of the input analog signal, and to calculate the average value. Finally, the detection circuit 6 produces a reference voltage.

Obviously, the predescription shows that the detection circuit 6 is a very complicated method for generating the reference voltage. Moreover, it increases the cost and complexity of the circuit, because the detection circuit 6 includes too many circuit elements.

Thus, there still remains a need for a detection circuit which overcomes the drawback of the conventional detection circuit for a computer mouse, and which provides for simplified circuit design.

SUMMARY OF THE INVENTION

For obviating the aforementioned problem and drawback found in the conventional detection circuit of reference voltage for computer mouse, it is a primary object of the present invention to provide an improved automatic detection circuit of optical coupling input signal for computer mouse that simplifies the design of circuit by tracking the change of waveform of input voltage. However, it also can decreases the cost of circuit by reducing the employment of analog signal processed circuit, because it detects the different slope of input voltage to determine whether the phototransistor is operated in conduction or cut-off state. Moreover, it does not have to provide a precise dc reference voltage, so that the cost of the circuit can be reduced furthermore. The present invention, on the other hand, can avoid the shortcoming that the input voltage is detected incorrectly when the level of the input signal voltage of phototransistor 1 is over or under the level of the fixed reference voltage 5, and it will increase the reliability o the detection circuit.

In order that the present invention may more readily be understood, the following description is given, merely be the way of example, reference being made to the accompanying drawings, wherein:

DETAILED DESCRIPTION OF THE PREFERRED EMBODIMENT

Figure 3:
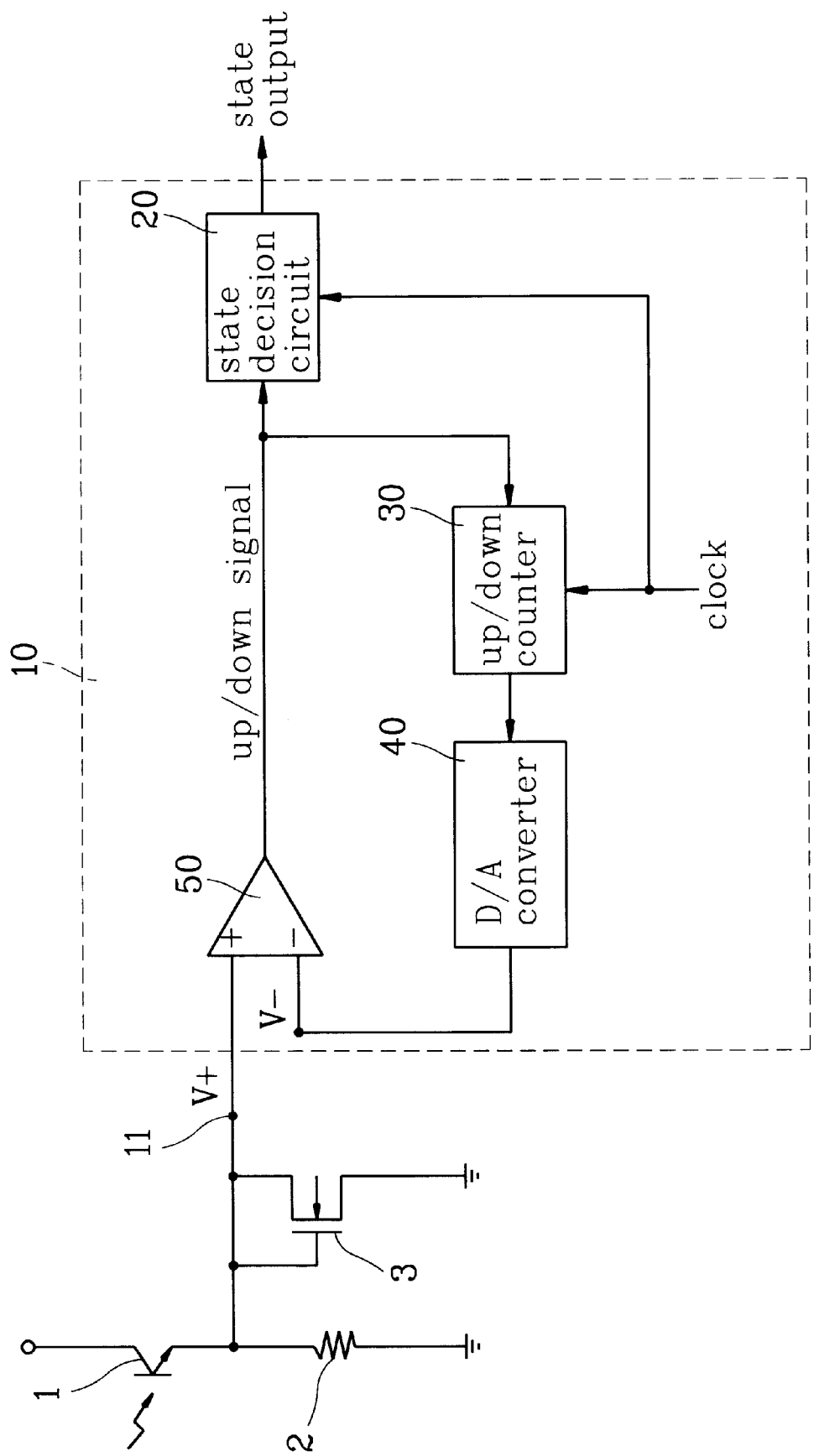
FIG. 3 is a schematic diagram of an automatic detection circuit of optical coupling input signal for computer mouse in accordance with a first preferred embodiment of the present invention.

The present invention relates to an automatic detection circuit of optical coupling input signal for computer mouse, employs the method that tracks the different slope of the waveform transmitted from an phototransistor to produce a digital output which can detect the movement of computer mouse, and it improves the drawback of conventional detection circuit for computer mouse. Referring to FIG. 3, is a schematic diagram of automatic detection circuit of optical coupling input signal for computer mouse in accordance with a first preferred embodiment of the present invention. It shows that the signal transmitted from a phototransistor 1 connected to a signal detection circuit 10 of the first preferred embodiment of the present invention, and the connecting point is an input terminal 11. The phototransistor 1 is used to deal with the optical coupling input signal which is transmitted into an analog voltage signal. In order to avoid the output voltage of the phototransistor 1 being exceeded, the prior art employs a NMOS transistor 3 and a resistor 2 connected with the input terminal 11 to adjust the value of equivalent resistor. The signal detection circuit 10 includes a comparator 50 whose noninverting input is connected to the signal transmitted from the phototransistor 1, and the connecting point is also the input terminal 11. The inverting input of the comparator 50 is connected to an analog signal sent from a D/A converter 40, so that the comparator 50 compares the two signals and produces an up/down signal. The up/down signal is connected to a state decision circuit 20 in order to determine whether the phototransistor 1 is operated in conduction or cut-off state, and it is also connected to an up/down counter 30 in order to transfer the up/down signal into a digital signal output which represents the count of the up/down signal is increased or decreased. The digital signal is transmitted from the up/down counter 30 connected to a D/A converter 40 for transferring into an analog signal, and the analog signal can be compared with the output signal of the phototransistor 1. A clock is connected to both of the up/down counter 30 and the state decision circuit 20 to synchronize the control of the state decision circuit 20 and the up/down counter 30. The state decision circuit 20 also produces a state output signal for the other control circuits of computer mouse, so the movement of computer mouse will be determined.

The different slope of input signal is tracked by way of the up/down signal counted and then transmitted into an analog signal in the first preferred embodiment of the present invention. After a moment, if the state of up/down signal is in up state, then we know that the input voltage signal is increased. On the contrary, if the state of up/down signal is in down state, then we know that the input voltage signal is decreased. Therefore, we can determine that the phototransistor 1 is turned on or turned off. According to whether the state of up/down signal is in up state or not the state decision circuit 20 outputs a different state signal, then the movement of computer mouse will be detected.

Two input signals of the comparator 50 are the signal $V_+$ transmitted from the phototransistor 1 and the signal $V_-$ transmitted from the D/A converter 40, so that an up/down signal is produced by comparing the two signals, and the means of comparing are described as follows:

1. When the signal $V_+ > V_-$, the output of comparator 50 is "HIGH", and this output signal means that the count of up/down counter is not enough. On the other hand, it is the logic accordance that detects the state of input voltage.
2. When the signal $V_+ < V_-$, the output of comparator 50 is "LOW", and this output signal means that the count of up/down counter is too much, it should be counted down contrary. On the other hand, it is the logic accordance that detects the state of input voltage.

Consequently, the detected method is in foundation with tracking the input state to acquire the different slope of input waveform, so that we can produce an output signal, it represents a state of whether the phototransistor 1 is conducted or cut-off now.

Figure 4:
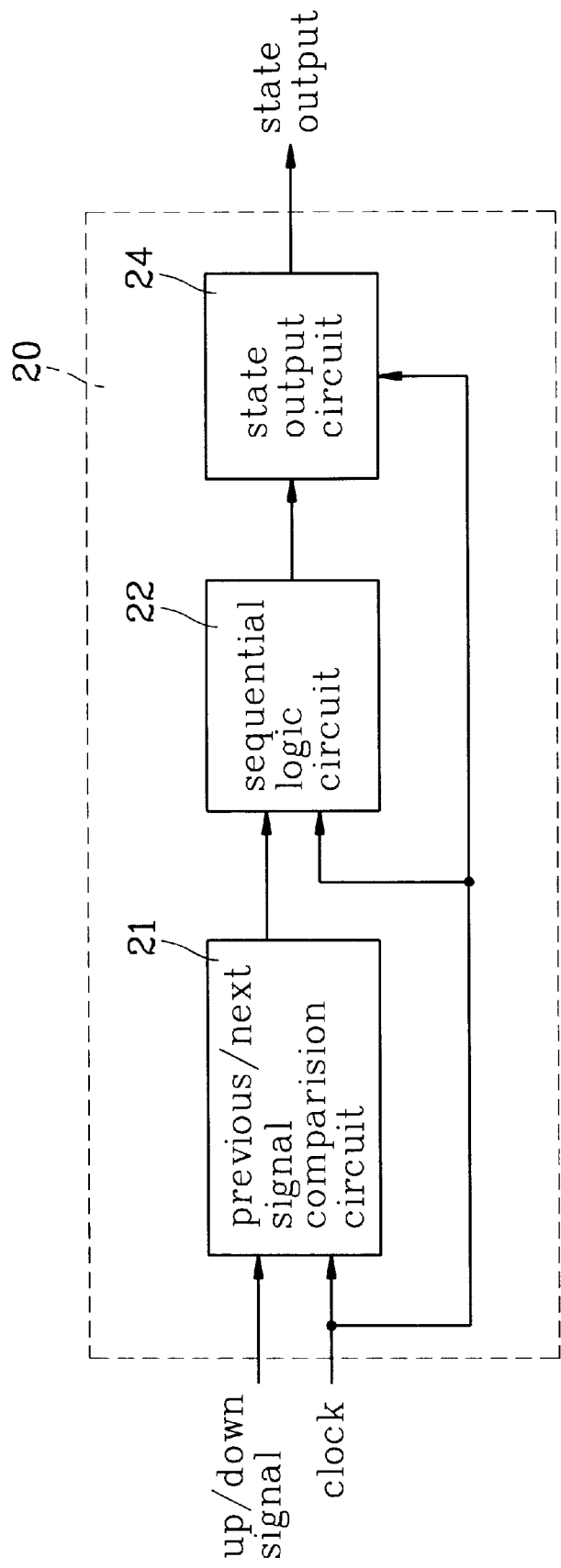
FIG. 4 is a block diagram of the state decision circuit of the first preferred embodiment of the present invention.

FIG. 4 is a block diagram of the state decision circuit 20 of the first preferred embodiment of the present invention. It shows that the state decision circuit 20 comprises a previous/next signal comparision circuit 21, a sequential logic circuit 22 and a state output circuit 24. The two input signal of the previous/next signal comparision circuit 21 are the up/down signal and the clock, the clock is also commonly connected to the sequential logic circuit 22 and the state output circuit 24. The up/down signal is transmitted into the four states which are up-up, up-down, down-up and down-down generated from the previous/next signal comparision circuit 21. Then the state signal is sent to the sequential logic circuit 22 which produces a different state signal, so that the different sequential state can be changed, however, it's corresponded with different input state of comparator 50. The output signal of the sequential logic circuit 22 is connected to the state output circuit 24 for producing an output "HIGH" or "LOW" that is corresponded with different input state, and the output is sent to the other control circuit of computer mouse. Thus the state decision circuit 20 in the first preferred embodiment of the present invention is accomplished.

The determination rules of the state decision circuit 20, are described in detail as follows:

1. The output of the state decision circuit 20 is "LOW" when the series signals of the up/down signal are accumulated twice in down-down state, which means that the previous signal is in down state and the present signal is also in down state. On the contrary, if the series signals of the up/down signal are not accumulated twice in down-down state, the output of the stage decision circuit 20 will not be changed.
2. The output of the state decision circuit 20 is "HIGH" when the series signals of the up/down signal are accumulated twice in up-up state, which means that the previous signal is in up state and the present signal is also in up state. On the contrary, if the series signals of the up/down signal are not accumulated twice in up-up state, the output of the stage decision circuit 20 will not be changed.
3. In the accumulation, the state combination of up/down or down/up does not affect the result of accumulation, but the state combination of up/up or down/down will affect the result of accumulation, moreover, it also means that the accumulation counteracted each other. For example, in the accumulation, if the previous up/down signal is detected in down-down state and the present up/down signal is detected in up/up state, then the accumulation of down-down state will be counteracted to resume normal state. On the contrary, if the previous up/down signal is detected in up/up state and the present up/down signal is detected in down-down state, then the accumulation of up/up state will be counteracted to resume normal state.

Figure 1:
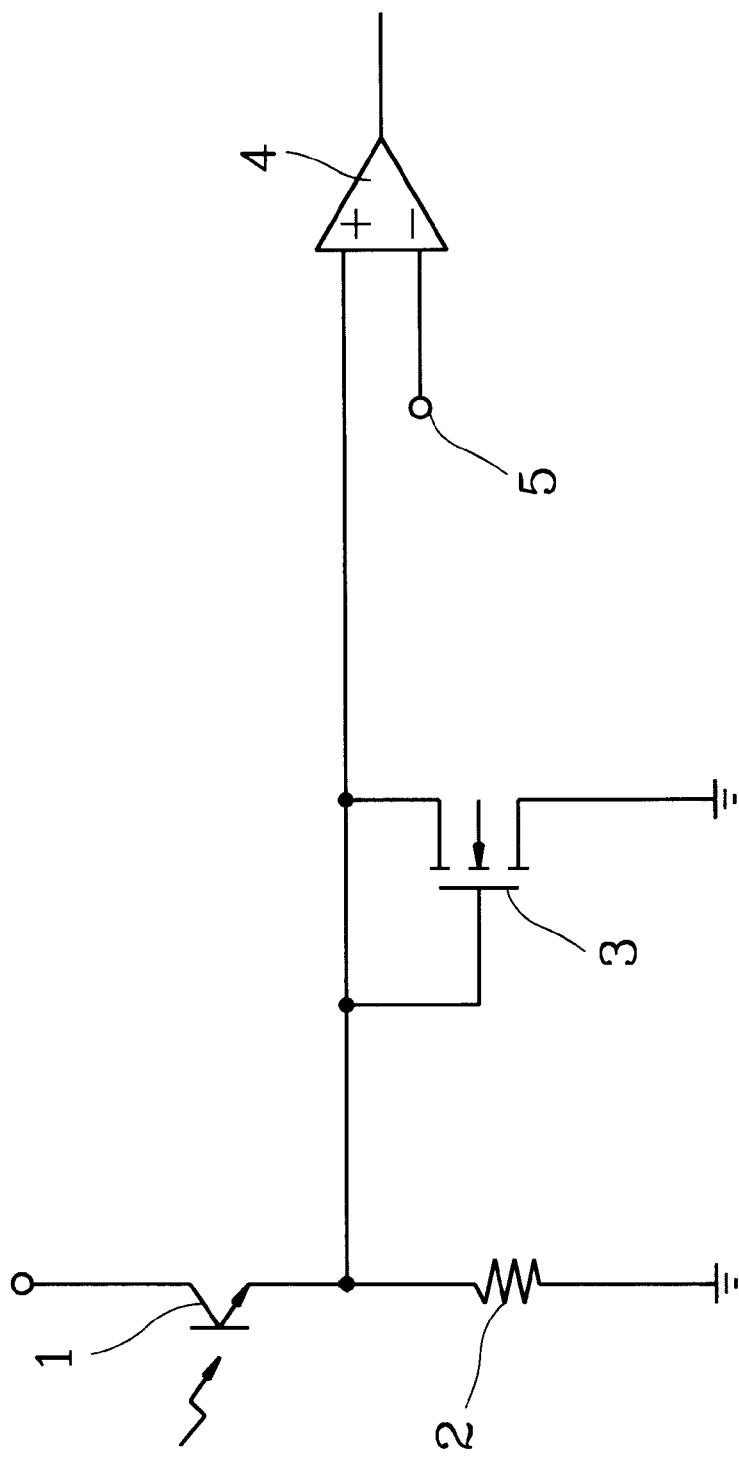
FIG. 1 is a schematic diagram of a conventional photocoupling input signal detector for a computer mouse.
Figure 2:
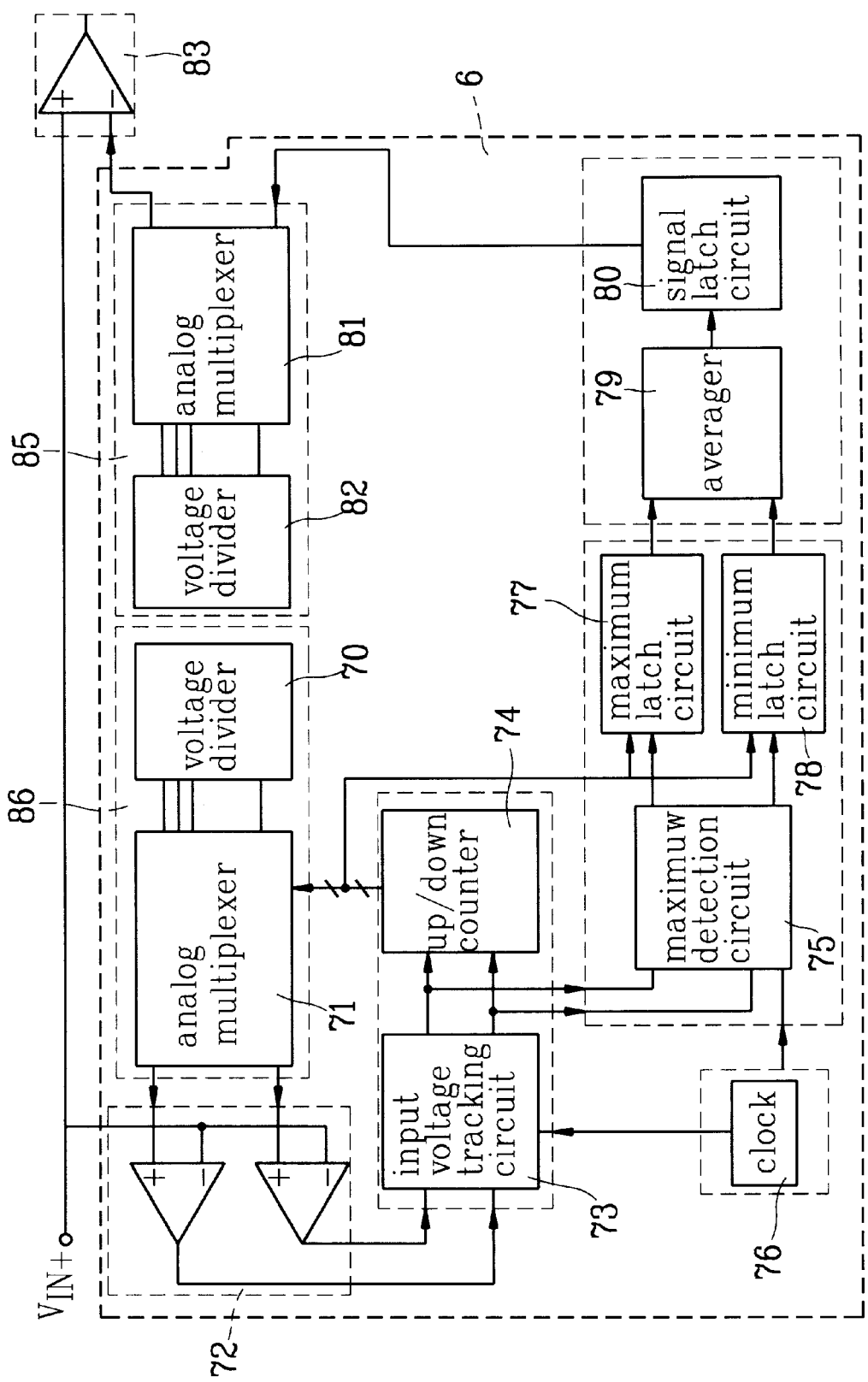
FIG. 2 is a block diagram of a prior art detection circuit of reference voltage for computer mouse.
Figure 5:
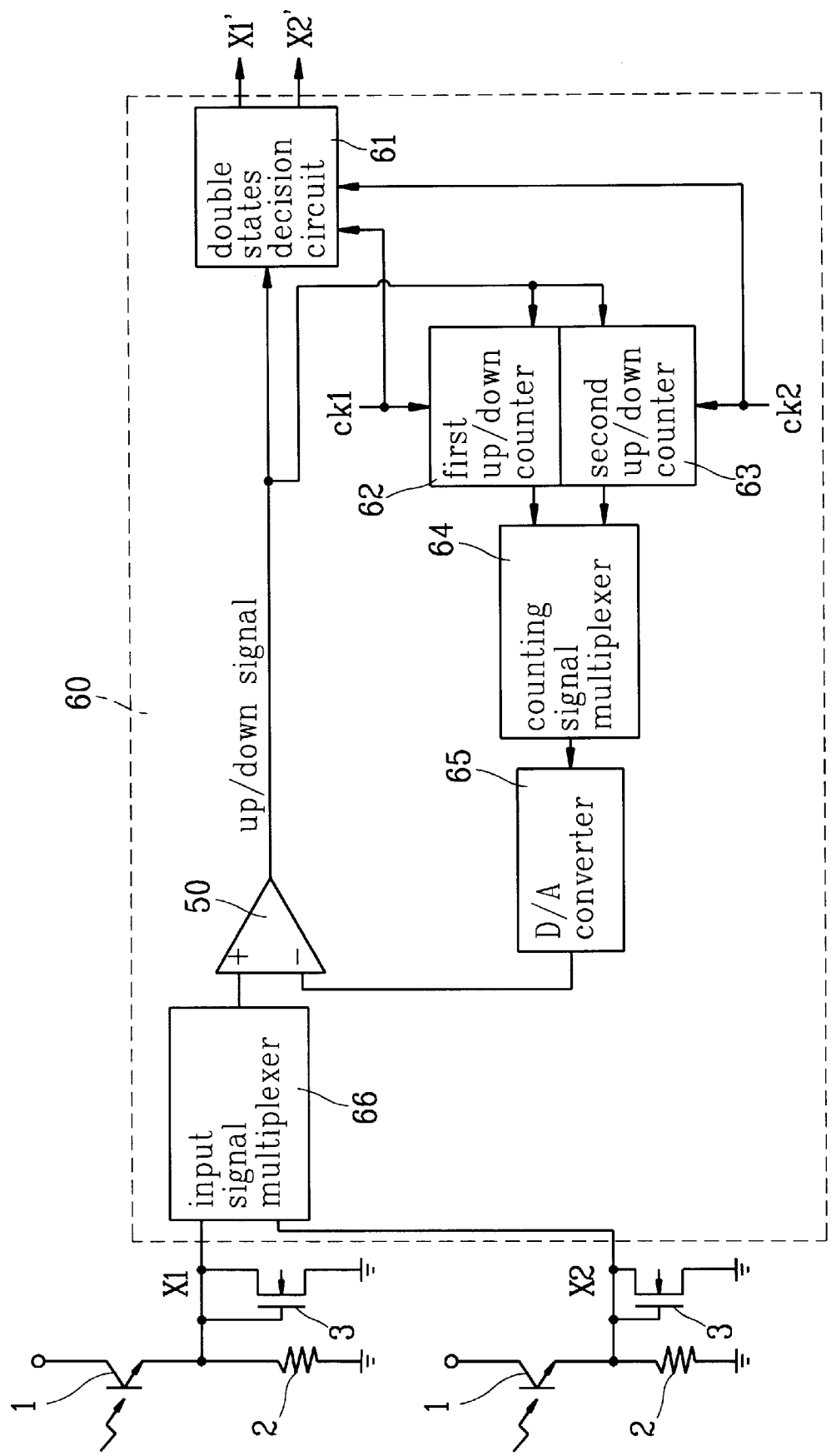
FIG. 5 is a block diagram of an automatic detection circuit of optical coupling input signal for computer mouse in accordance with a second preferred embodiment of the present invention.

FIG. 5 is a block diagram of automatic detection circuit of optical coupling input signal for computer mouse in accordance with a second preferred embodiment of the present invention. The main difference between the first and second preferred embodiment is that the second preferred embodiment deals with two signals shown in FIG. 5 as a first detected signal $X_1$ and a second detected signal $X_2$. A double signal detected circuit 60 shown in FIG. 5 comprises an input signal multiplexer 66, a comparator 50, a double states decision circuit 61, a first up/down counter 62, a second up/down counter 63, a counting signal multiplexer 64 and a D/A converter 65. The two input signals of the input signal multiplexer 66 are the first detected signal $X_1$ transmitted from the phototransistor 1 and the second detected signal $X_2$ transmitted from the other phototransistor 1, so that the two input signals can be multiplexed as one output signal to economize the use of the comparator and D/A converter. The function and connecting of the phototransistor 1, resistor 2 and NMOS transistor 3 are the same way shown in FIG. 1.

The output signal of the input signal multiplexer 66 is sent to the noninverting input of the comparator 50, and the analog signal transmitted from the D/A converter 65 is sent to the inverting input of the comparator 50, so the two signals can be compared in order to produce an up/down signal which represents the input state of computer mouse. The up/down signal is connected to the double states decision circuit 61 in order to determine whether the phototransistor 1 operated in conduction or cut-off state, on the other hand, it connected to a first up/down counter 62 and a second up/down counter 63 in order to transfer the up/down signal into a digital signal output which represents whether the count of the up/down signal is increased or decreased.

A first clock signal ck1 and a second clock signal ck2 are connected to the first up/down counter 62 and the second up/down counter 63 respectively to synchronize the counting of counters. The two digital signals transmitted from the first up/down counter 62 and the second up/down counter 63 are sent to a counting signal multiplexer 64, so that the two digital signals can be transmitted as one digital signal. Furthermore, the digital signal is connected to the comparator 50 for comparing with the output signal of the input signal multiplexer 66.

The double states decision circuit 61 is also connected with the first clock signal ck1 and the second clock signal ck2 to synchronize with the up/down signal, then output a first output signal $X_1'$ and a second output signal $X_2'$ for the other control circuits of computer mouse. In the sequential multiplex operation, the first up/down counter 62 and the second up/down counter 63 can acquire the up/down signal individually and count correctly, although the two counter 62, 63 can be connected with the same up/down signal. Therefore, the second preferred embodiment of the present invention is used to detect the different slope waveform of the input signal voltage, so we will know whether the phototransistor 1 operated in conduction or cut-off state and the movement of computer mouse will be detected. In this embodiment, the double states decision circuit 61 includes two units of state decision circuit 20 shown in FIG. 3, and it determines the series up/down signal by the way of sequential multiplex method to produce two digital output signals that represent the two phototransistor operated in conduction or cut-off state. The main difference between the double states decision circuit 61 and the state decision circuit 20 is that the state decision circuit 20 is connected with only one clock signal, but the double states decision circuit 61 is connected with two clock signals. The double states decision circuit 61 is accomplished completely as mentioned above.

Furthermore, we can expand the double states decision circuit 61 into a four states decision circuit or a circuit that decides more than four states by the same way of the state decision circuit 20 corresponded with the double states decision circuit 61, that is, using four states decision circuit includes four units of state decision circuit 20 as shown in FIG. 3. The four states are illustrated as the signals $X_1$, $X_2$, $Y_1$ and $Y_2$ for computer mouse detected. Thus, the input signal multiplexer 66 and counting signal multiplexer 64 are regulated as four input signals form or more than four input signals, in addition, install four up/down counters and use the four states decision circuit or a circuit that decides more than four states, so that the expanded detection circuit can deal with four input signals or more than four input signals. Therefore, we can expand the embodiment of the present inveniton by adapting the amount of circuits.

While this invention has been described in connection with what is presently considered to be the most practical and preferred embodiment, it is to be understood that the invention is not limited to the disclosed embodiments, but on the contrary, it is intended to cover various modifications and equivalent arrangements included within the spirit and scope of the appended claims.

We claim:

1. A photocoupling signal detection circuit for a computer mouse, which produces a digital output by tracking the change of input voltage waveform, comprising:

a comparator for comparing said signal transmitted from a phototransistor and an analog variable voltage generated by a D/A converter, and then output an up/down signal;

a state decision circuit for receiving an up/down signal transmitted from said comparator and generating a state output signal;

an up/down counter for counting said up/down signal and generating a digital signal;

a D/A converter for converting said digital signal into an analog signal which is connected to said comparator;

wherein, said state decision circuit and said counter are connected with a clock signal to synchronize the control of said state decision circuit and said counter.

2. The photocoupling signal detection circuit for a computer mouse of claim 1, wherein said state decision circuit, comprising:

a previous/next signal comparison circuit for receiving said up/down signal and said clock signal, and generating a different state signal;

a sequential logic circuit for receiving said different state signal and said clock signal, and generating a different sequential state signal; and a state output circuit for receiving said different sequential state signal and said clock signal, and generating a state output signal.

3. A photocoupling signal detection circuit for a computer mouse, which produces two digital outputs by tracking the change of two input voltage waveform, comprising:

an input signal multiplexer for receiving two detected signals and generating an output signal;

a comparator for comparing said output signal transmitted from said input signal multiplexer and an analog signal transmitted from a digital/analog converter;

a double states decision circuit for receiving an up/down signal transmitted from said comparator and generating a two state output signal;

two up/down counters for receiving said up/down signal and two clock signals, and generating two digital signals;

a counted signal multiplexer for receiving said two digital signals and generating a digital signal, and means for converting said digital signal into an analog signal which is connected to said comparator.

4. The photocoupling signal detection circuit for a computer mouse of claim 3, wherein said double states decision circuit includes two units of said state decision circuits.

* * * * *